United States Patent
Song et al.

(10) Patent No.: US 7,095,057 B2
(45) Date of Patent: Aug. 22, 2006

(54) SEMICONDUCTOR LASER AND METHOD FOR MANUFACTURING THE SAME

(75) Inventors: Jung Ho Song, Seoul (KR); Chul Wook Lee, Daejon-Shi (KR); Ki Soo Kim, Jeonju-Shi (KR); Yong Soon Baek, Daejon-Shi (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 10 days.

(21) Appl. No.: 10/785,054

(22) Filed: Feb. 25, 2004

(65) Prior Publication Data

US 2005/0121680 A1 Jun. 9, 2005

(30) Foreign Application Priority Data

Dec. 5, 2003 (KR) .............. 10-2003-0088260

(51) Int. Cl.
*H01S 5/227* (2006.01)
(52) U.S. Cl. .............. 257/94; 257/98; 257/99; 257/100; 257/101; 372/45.01; 372/46.01
(58) Field of Classification Search .......... 257/11, 257/13, 79, 81, 88, 94, 98–101; 372/45, 372/46
See application file for complete search history.

(56) References Cited

U.S. PATENT DOCUMENTS

| 5,311,534 A | * | 5/1994 | Mori et al. ........... 372/46.01 |
| 5,665,612 A | | 9/1997 | Lee et al. |
| 5,742,631 A | * | 4/1998 | Paoli ..................... 372/50 |
| 5,949,809 A | * | 9/1999 | Ashida ................. 372/46.01 |
| 6,110,756 A | | 8/2000 | Otsuka et al. |
| 2005/0151144 A1 | * | 7/2005 | Kish et al. ................ 257/94 |

FOREIGN PATENT DOCUMENTS

| JP | 05-167191 | 7/1993 |
| KR | 10-1998-031975 | 7/1998 |

OTHER PUBLICATIONS

G. Pakulski, et al.; "*Semi-insulating buried heterostructure laser with PN fence*"; Electronics Letters; vol. 38, No. 25; Dec. 5, 2002; pp. 1680-1682.

* cited by examiner

*Primary Examiner*—Thomas L. Dickey
(74) *Attorney, Agent, or Firm*—Mayer, Brown, Rowe & Maw LLP

(57) ABSTRACT

Provided is a semiconductor laser including a substrate etched into a mesa structure, an active layer, clad layers, a current blocking layer, an etch-stop, an ohmic contact layer, and electrodes, and a method for manufacturing the same, whereby it is possible to improve a ratio of light output to input current by blocking a leakage current flowing outside an active waveguide in a BH laser.

10 Claims, 10 Drawing Sheets

SEMICONDUCTOR LASER AND METHOD FOR MANUFACTURING THE SAME

BACKGROUND

1. Field of the Invention

The present invention relates to a buried heterostructure and, more particularly, to a semiconductor laser capable of improving a ratio of light output to input current by blocking a leakage current, which flows outside an active waveguide, and a method for manufacturing the same.

2. Discussion of Related Art

Generally, a buried heterostructure (BH) laser has an excellent ratio of light output to input current since currents could be injected only into an active waveguide, restrictively. For preventing currents from flowing outside the active waveguide in the BH laser, two methods for blocking currents have been used, as follow.

According to one method, a thyristor is formed by alternatively stacking two semiconductor layers doped with p type and n type.

For example, U.S. Pat. No. 5,665,612 ("Method for fabricating a planar buried heterostructure laser diode" by J. K. Lee et al.) proposes a method for growing a semiconductor layer after forming a mesa structure by making use of non-selective and selective etchings.

Referring to FIG. 1, an active layer 2 and a clad layer 3 are formed on an n-InP substrate 1, and then, a mesa structure is formed by making use of a non-selective and a selective etching processes. A p-InP current blocking layer 4 and an n-InP current blocking layer 5 are formed in etched portions of both sides in the mesa structure. A p-InP clad layer 6 is formed all over the upper portion including the mesa structure, and an ohmic contact layer 7 is formed on the clad layer 6.

For currents blocking, a thyristor may be formed by n-p-n-p type semiconductor layers 1, 4, 5, and 6, in the portions where the mesa structure is excluded. At this time, one portion d1, where the active layer 2 of an upper portion in the mesa structure is contacted with the p-InP current blocking layer 4, should be thinner than the other portion d2, where the mesa structure is excluded, in order to have a large resistance, thereby effectively reducing a leakage current through a diode, which is formed by the n type substrate 1 and the p type current blocking layer 4. Meanwhile, the portion except the mesa structure should be thick to serve as the thyristor.

U.S. Pat. No. 6,110,756 ("Method for producing semiconductor laser" by N. Otsuka et al.) proposed a method for optimizing efficiency of a current blocking layer with reliability of a device.

Referring to FIG. 2, an active layer 12 and a clad layer 13 are formed on an n-InP substrate 11, and then, a mesa structure is formed by means of an etching process using a predetermined mask. An undoped InP semiconductor layer 14, a p-InP current blocking layer 15 and an n-InP current blocking layer 16 are formed in etched portions of both sides in the mesa structure. A p-InP clad layer 17 is formed all over the upper portion including the mesa structure, and an ohmic contact layer 18 is formed on the clad layer 17.

Except the portion having the mesa structure, the rest are constituted by a thyristor comprising n-p-n-p type semiconductor layers 11, 15, 16, and 17 to prevent a current blocking. At this time, if the p type semiconductor layer 15 has higher doping concentration, a current blocking of the thyristor becomes more effective. However, since the p type semiconductor layer 15 is formed close to the active layer 12 of an upper portion in the mesa structure, a p type Zn ion doped into the p type semiconductor layer 15 is likely to diffuse into the active layer 12. The diffused Zn ion may affect doping types of the active layer 12 and the semiconductor layers in the vicinity thereof, and thus, change a characteristic of a device. Therefore, before growing the p type semiconductor layer 15, the undoped InP semiconductor layer 14 is formed thin to prevent diffusion of Zn ion. As a result, the p type semiconductor layer 15 could be doped without considering the diffusion of Zn ion into the active layer 12, so that the structure of the thyristor constituted by the p-n-p-n type semiconductor layers could be optimized.

The other method for blocking currents is such a method that a mesa structure is formed by means of an etching process and then a semi-insulating semiconductor layer is grown instead of the p-n-p-n type semiconductor layers. However, in the case of growing the semi-insulating semiconductor layer, there has been a problem that Fe ion is replaced by Zn ion doped into the p type semiconductor layer, so that the semi-insulating semiconductor would be changed into the p type semiconductor. For prevent this, a thin n type semiconductor layer may be grown before the semi-insulating semiconductor layer is grown. At this time, it is preferable that the thickness of the n type semiconductor layer is not too thin or thick. If the thickness of the n type semiconductor layer becomes too thin, substitution of the doped ions cannot be prevented. By contrast, if the thickness of the n type semiconductor layer becomes too thick, a leakage current through the n type semiconductor layer would be generated.

For high-speed operation of a device, a characteristic of a current blocking layer should be enhanced and a capacitance should be lowered. Therefore, it is required to reduce an area of a device composing part in such a structure that the thyristor is formed by employing the semiconductor layers, as described above. In the case of etching the semiconductor layers composing the thyristor, except the active waveguide, the area of the thyristor can be reduced, however, it may deteriorates a heat dissipation, the heat being generated in the active waveguide.

In a paper by G. Pakulski and etc. ("Semi-insulating buried heterostructure laser with PN fence", Electronics Letters IEE Vol. 38, No. 25, pp. 1680~1682, 2003), a method for etching a p type and an n type semiconductor layers composing the thyristor with only leaving the vicinity of the active waveguide and then filling the etched portions with a semi-insulating semiconductor has been proposed.

Referring to FIG. 3, an active layer 22 and a clad layer 23 are formed on an n-InP substrate 21, and then, a mesa structure is formed by means of an etching process using a predetermined mask. A p-InP current blocking layer 24 and an n-InP current blocking layer 25 are formed in etched portions of both sides in the mesa structure. A p-InP clad layer 26 is formed all over the upper portion including the mesa structure, and an ohmic contact layer 27 is formed on the clad layer 26. In the vicinity of the active waveguide, the ohmic contact layer 27, the clad layer 26, the n-InP current blocking layer 25, and the p-InP current blocking layer 24 are etched, and then a semi-insulating semiconductor layer 28 is formed in the etched portions.

In such a structure, a ratio of light output to current may be improved a little more, as compared to that of the thyristor structure constituted by the semiconductor layers only, and a reduced capacitance could be obtained.

As described above, in the case of employing the method of etching the current blocking layer around the mesa structure and then filling the etched portions with the semi-insulating semiconductor, a characteristic of the BH laser can be enhanced, however, a leakage current may be generated if the current blocking layer does not work sufficiently at a high temperature or a high operation current. In addition, it is difficult to perform processes since the etched depth is deep, and processes would be complicated since the semi-insulating semiconductor layer should be grown. Further, the width of the mesa structure cannot be formed narrowly due to difficulty of a deep etching process and an inter diffusion phenomenon, in which Zn and Fe ions are substituted each other.

SUMMARY OF THE INVENTION

The present invention is directed to a semiconductor laser capable of improving a ratio of a light output to an input current by blocking a leakage current flowing outside an active waveguide in a BH laser, and a method for manufacturing the same.

Further, according to the present invention, currents spreading can be reduced by forming a thin semiconductor layer of an upper portion in a current blocking layer, and a voltage applied to the current blocking layer can be reduced by forming a clad of the upper portion with a predetermined width and increasing an electric resistivity of conduction path from electrode to blocking layer.

One aspect of the present invention is to a semiconductor laser, comprising: a substrate etched into a mesa structure; an active layer formed on the mesa structure and being a core of a waveguide; a first clad layer formed on the active layer; a current blocking layer formed on the etched substrate in both sides of the mesa structure; an etch-stop layer formed on the first clad layer and the current blocking layer; a second clad layer formed on the etch-stop layer being located on an upper portion of the mesa structure, with a predetermined width; an ohmic contact layer formed on the second clad layer; a first electrode contacted with the ohmic contact layer; and a second electrode formed on a bottom side of the substrate.

Here, the current blocking layer may be formed by a first p type, an n type, and a second p type semiconductor layers, and the second p type semiconductor layer is formed with a thickness thinner than that of the first p type semiconductor layer, preferably, 0.2 µm or less. And the second clad layer may be a p type semiconductor layer.

In a preferred embodiment of the present invention, a layer for planarization in both sides of the second clad layer and the ohmic contact layer may be further included.

Another aspect of the present invention is to provide a method for manufacturing a semiconductor laser, comprising the steps of: forming an active layer and a first p type semiconductor layer on an n type substrate and etching exposed portions of the first p type semiconductor layer, the active layer, and the substrate by a predetermined thickness, by means of an etching process using a first mask pattern, thereby forming a mesa structure; forming a current blocking layer by growing a second p type, an n type, and a third p type semiconductor layers in the etched portions of both sides in the mesa structure; forming an etch-stop layer all over the structure after removing the mask pattern, and growing a fourth p type semiconductor layer and an ohmic contact layer on the etch-stop layer; patterning exposed portions of the ohmic contact layer and the fourth p type semiconductor layer with a predetermined width, by means of an etching process using a second mask pattern; exposing the surface of the ohmic contact layer after planarizing the whole surface of the resultant structure; and forming an electrode to be contacted with the ohmic contact layer.

Here, the third p type semiconductor layer is formed with a thickness of 0.2 µm or less. And the first and the second mask patterns are formed with a silicon nitride film or a silicon oxide film. Further, the fourth p type semiconductor layer is subjected to a selective etching process to form patterns, and the etching process is stopped at the time of the etch-stop layer being exposed.

DETAILED DESCRIPTION OF PREFERRED EMBODIMENTS

Hereinafter, the embodiments of the present invention will be explained with reference to the accompanying drawings. However, the embodiment of the present invention can be changed into a various type, and it should be not understood that the scope of the present invention is limit to the following embodiments. The embodiments of the present invention are provided in order to explain the present invention to those skilled in the art. On the other hand, like numerals present like elements throughout the several figures and the repeated explanation of the element will be omitted.

Figure 4A:
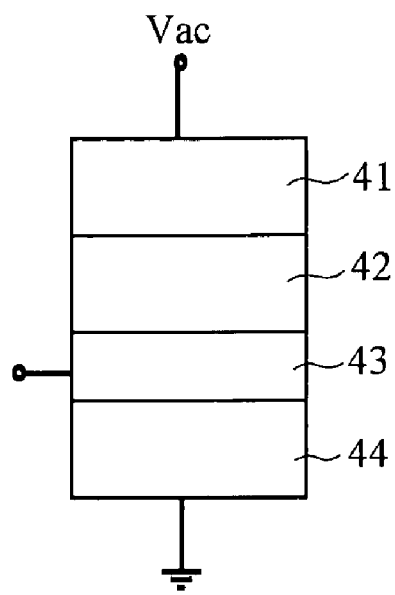
FIG. 4A is a schematic view of a current blocking layer comprising semiconductor layers.
Figure 4B:
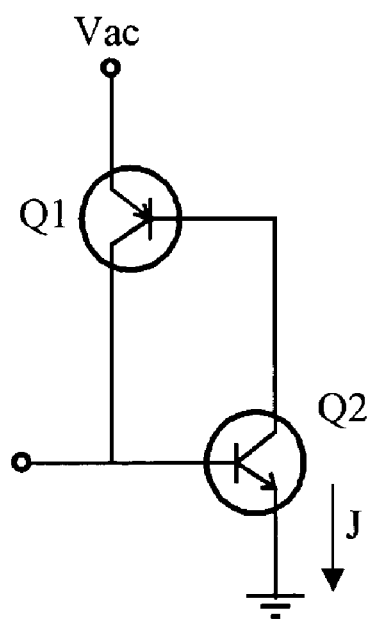
FIG. 4B is a circuit diagram of the current blocking layer shown in FIG. 4A.
Figure 5:
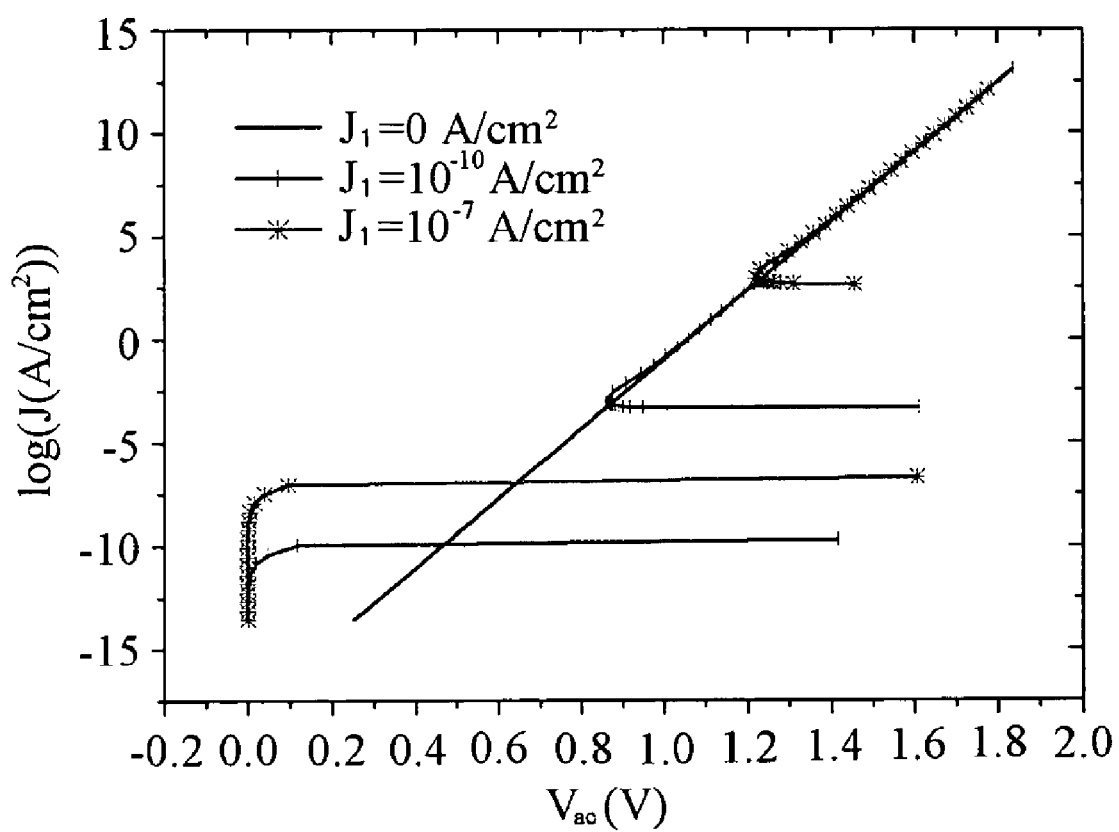
FIG. 5 is a graph showing current-voltage characteristic of transistors Q1 and Q2 of FIG. 4B, obtained by calculating with the Ebers-Moll model.

FIG. 4A is a schematic view of a current blocking layer comprising semiconductor layers. This structure may be represented by a circuit, in which a p-n-p transistor Q1 and an n-p-n transistor Q2 are connected in a pair between a power supply terminal Vac and a ground, as shown in FIG. 4B. FIG. 5 is a graph showing current-voltage characteristic of transistors Q1 and Q2 of FIG. 4B, obtained by calculating with the Ebers-Moll model. In FIG. 5, J1 is a space charge region current that lowers a gain of a transistor, and plays an important role in a low bias. The value of the current is variable depending on state of a semiconductor junction. In case where J1 is not "0" in FIG. 5, the thyristor has two states, that is, an "ON" state where a current increases with an increase of a voltage, and an "OFF" state where a current does not increase with an increase of a voltage. The two transistors Q1 and Q2 operate at a saturation region, in the case of the "ON" state, and operate at an active region, in the case of the "OFF" state. The two states may be varied depending on a potential of an n type semiconductor composing a base of the transistor Q1 and a collector of the transistor Q2. The semiconductor may be in a floating state, electrically.

There have been many opinions for the state of the thyristor, which composes a current blocking layer in the BH laser. The paper by T. Ohtoshi et al. ("Analysis of current leakage in InGaAsP/InP buried heterostructure lasers". IEEE Journal of Quantum Electronics, vol. 25, No.6, 1989) insists that the thyristor for blocking current in the BH laser is in the "ON" state on the basis of the result calculated in a two dimensional space. In case where the thyristor is in the "ON" state, a voltage applied to the thyristor should be lowered according to FIG. 4B, so as to reduce currents flowing into the current blocking layer, or the area of the thyristor should be reduced as mentioned in the paper by G. Pakulski.

Figure 6:
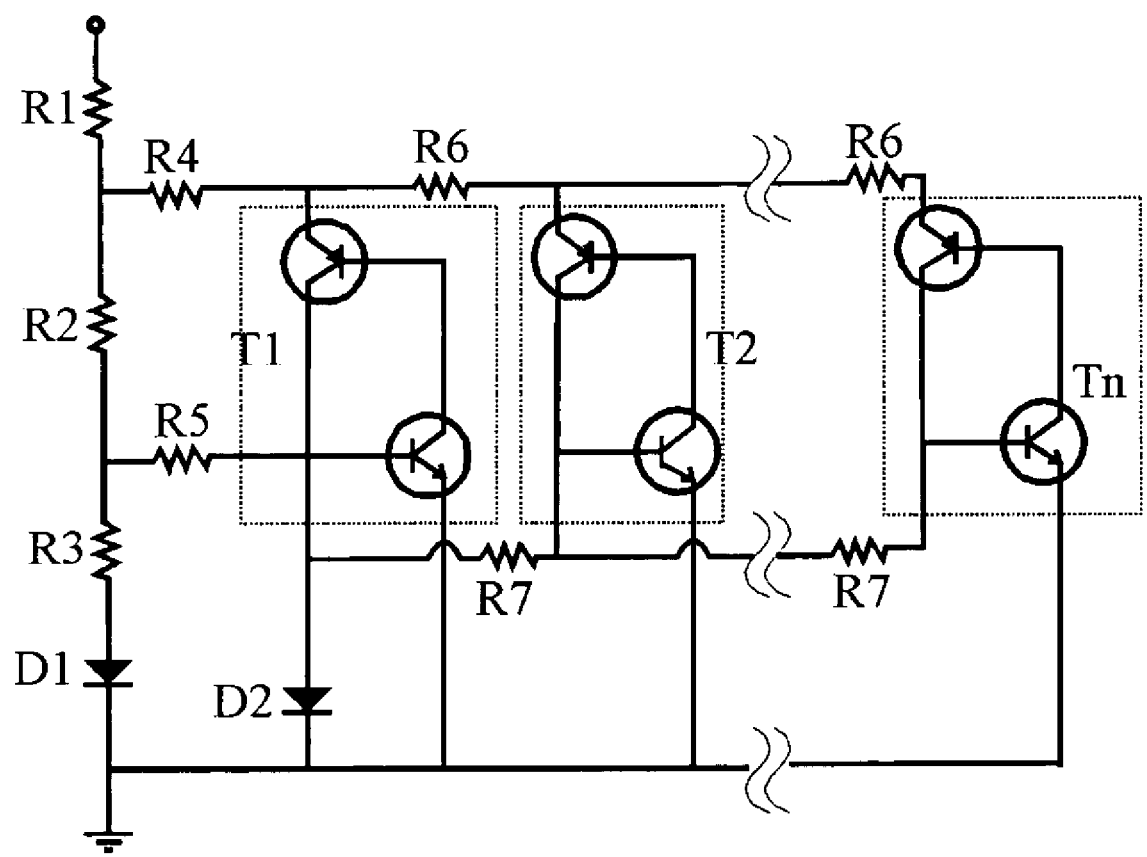
FIG. 6 is a circuit diagram of a BH laser including a thyristor constituted by semiconductor layers.

FIG. 6 is a circuit diagram of the BH laser including the thyristor constituted by p-n-p-n semiconductor layers.

The current blocking layer shows an effect that currents spread laterally, by having several thyristors T1, T2, . . . , and Tn–1 connected in parallel. The structure by G. Pakulski corresponds to such a structure that thyristors T2, . . . , and Tn are removed in the circuit diagram and the removed portions are filled with a semi-insulation semiconductor. In the structure of the present invention, a resistance of a resistor R6 is increased in the circuit diagram by forming a p type semiconductor layer, which becomes an upper clad, with a very small thickness. If plenty of currents come to flow into the thyristors T2, . . . , and Tn, the voltages applied to the thyristors T2, . . . , and Tn come to decrease due to a voltage drop being generated in the resistor R6. Therefore, currents flowing into the thyristors T2, . . . , and Tn would be decreased.

Next, a method for manufacturing the BH laser according to a preferred embodiment of the present invention will be explained in detail, with reference to FIGS. 7A to 7F.

Figure 7A:
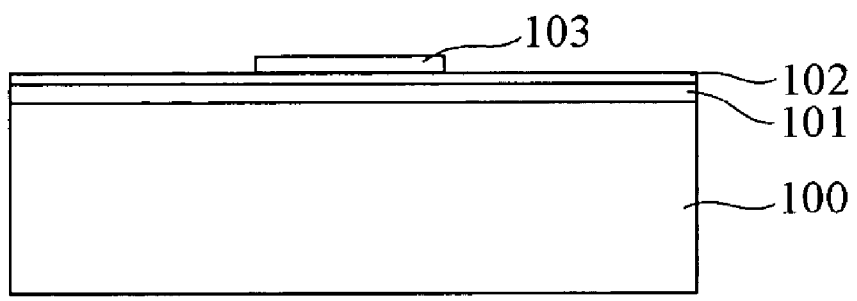
FIGS. 7A to 7F are cross sectional views for explaining a method for manufacturing a semiconductor laser according to the present invention.

Referring to FIG. 7A, an active layer 101 and a p type semiconductor layer 102 are sequentially formed on an n type semiconductor substrate 100, and then a mask pattern 103 for forming a mesa structure is formed on the p type semiconductor layer 102. The active layer 101 corresponding to a core of a waveguide, the n type substrate 100, and the p type semiconductor layer 102 corresponding to a clad of the waveguide may be an InGaAsP, an n-InP substrate, and a p-InP, respectively. The mask pattern 103 may be formed using a silicon nitride (SiN) or a silicon oxide (SiO) film.

Figure 7B:
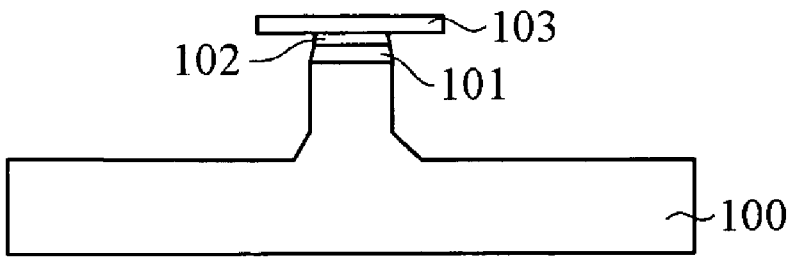

Referring to FIG. 7B, by means of an etching process using the mask pattern 103, the exposed portions of the p type semiconductor layer 102, the active layer 101, and the n type semiconductor substrate 100 are etched by a predetermined thickness to form a mesa structure.

Figure 7C:
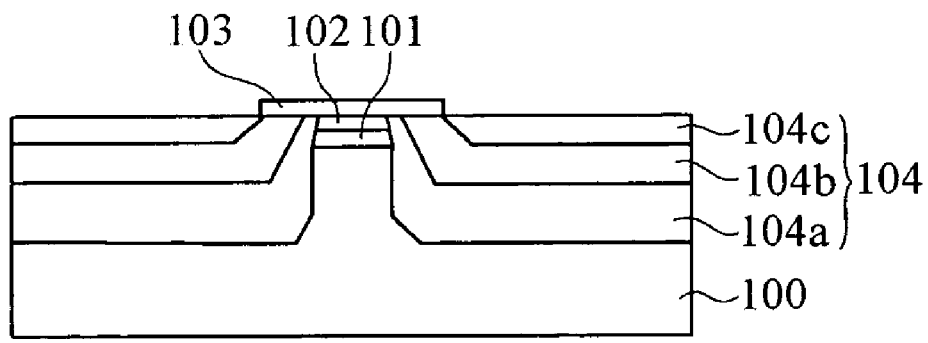

Referring to FIG. 7C, a p type semiconductor layer 104a, an n type semiconductor layer 104b, and a p semiconductor layer 104c are sequentially formed in the etched portions of both sides in the mesa structure so as to form a current blocking layer. At this time, the p type semiconductor layer 104c may be formed with a very thin thickness of 0.2 μm or less.

Figure 7D:
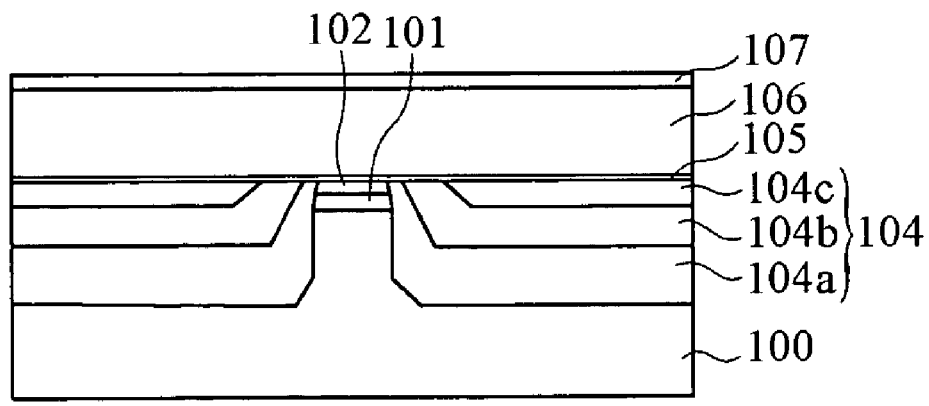

Referring to FIG. 7D, after the mask pattern 103 is eliminated, an etch-stop layer 105 is formed thin all over the structure, and then, a p type semiconductor layer 106 and an ohmic contact layer 107 are sequentially grown on the etch-stop layer 105. The etch-stop layer 105, the p type semiconductor layer 106 corresponding to a clad of a waveguide, and the ohmic contact layer 107 may be formed with a InGaAsP, p-InP, and p-InGaAs, respectively.

Figure 7E:
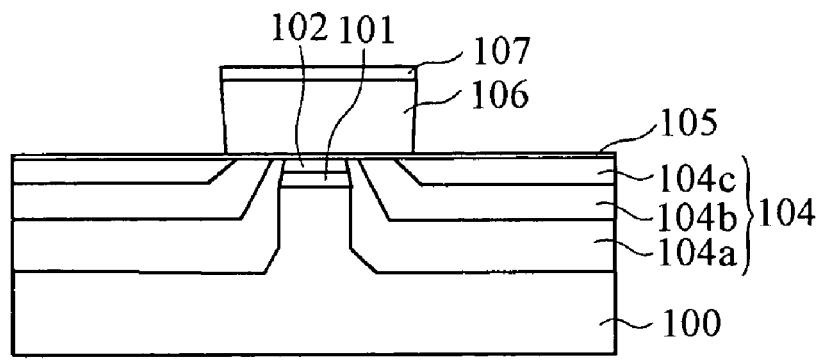

Referring to FIG. 7E, the p type semiconductor layer 106 and the ohmic contact layer 107 are subjected to a selective etching process to form patterns with a predetermined width after a mask pattern (not shown) is formed with a photo-resist, nitride film, or oxide film. Here, the etching process should be stopped at the time of the etch-stop layer 105 being exposed, and the ohmic contact layer 107 and the p type semiconductor layer 106 should be remained with a predetermined width from a waveguide core.

Figure 7F:
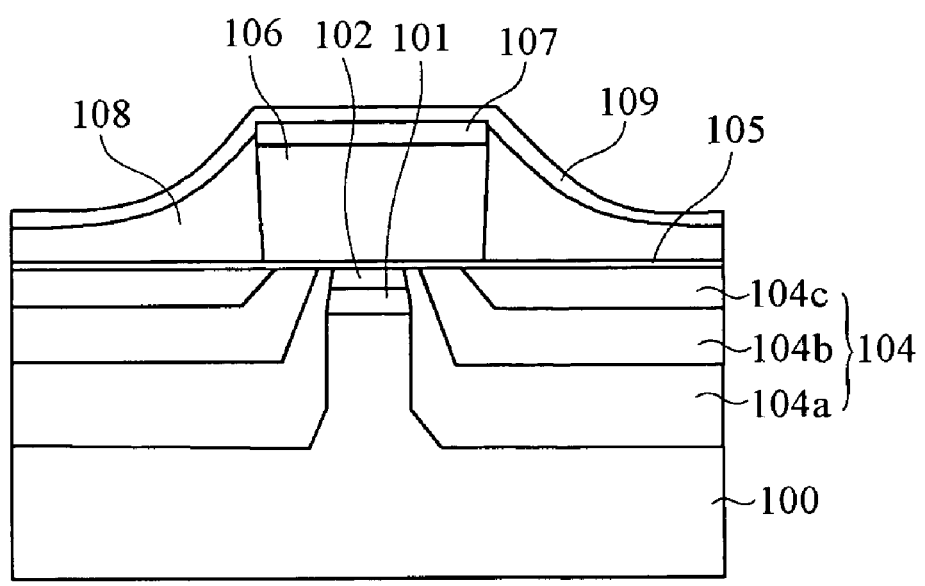

Referring to FIG. 7F, for planarization and electrical insulation, a layer 108 for planarization is formed with a spin-on-glass (SOG) and the like, and then, the layer 108 for planarization on the ohmic contact layer 107 is eliminated to expose the surface thereof. Thereafter, a metallic layer 109 is formed all over the structure to be contacted with the ohmic contact layer 107, so as to form an electrode. Meanwhile, the electrode may be formed on a bottom side of the substrate, by the metallic layer (not shown), as well. The metallic layer 109 may be formed with Ti/Pt/Au.

Preferably, the p type semiconductor layer 104c may be formed very thin with a thickness of 0.2 μm or less. Thus, emitters of the p-n-p transistors composing the thyristor may be connected to the electrode via the resistor R6 of FIG. 6 having very high resistance. Therefore, since the leakage currents through the thyristor have to pass the high resistor, the voltage applied to the current blocking layer composing the thyristor is decreased due to the voltage drop at the high resistor, so that a leakage current flowing outside the active waveguide would be minimized.

Figure 8:
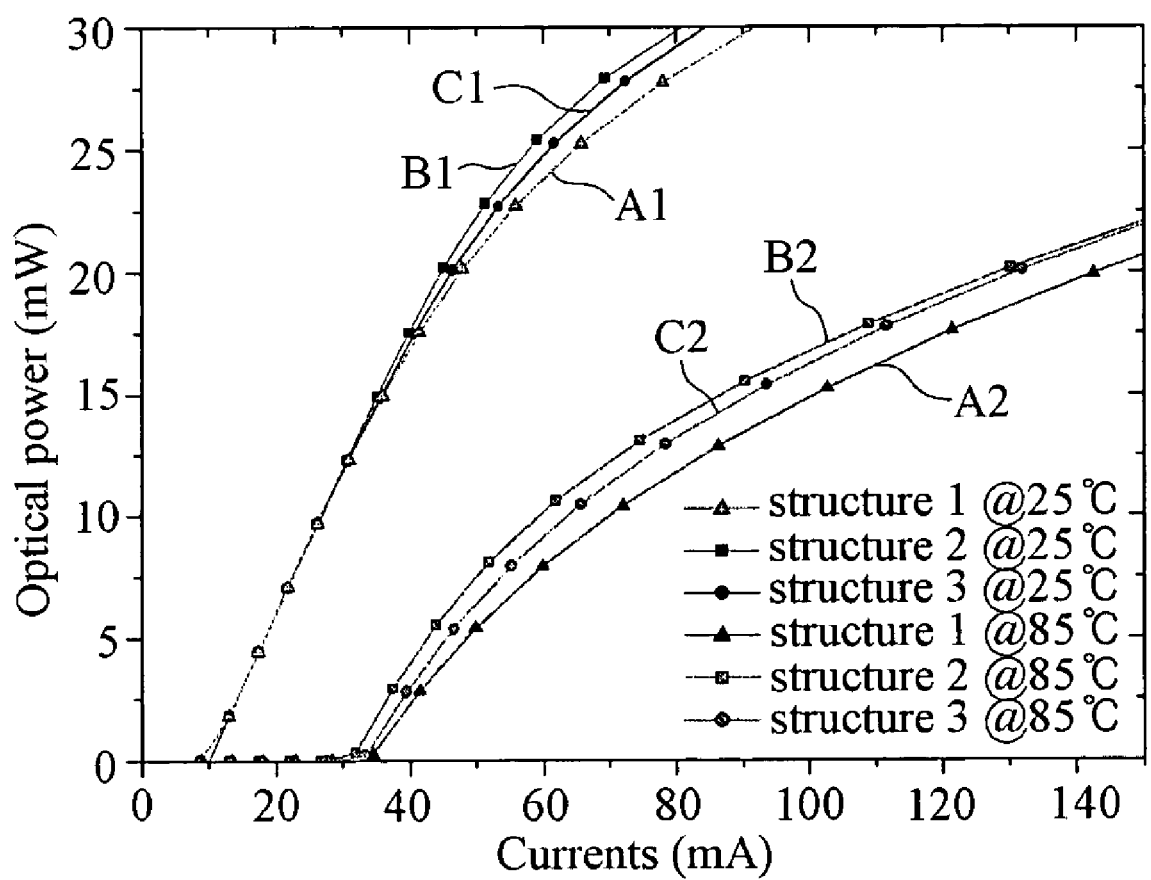
FIG. 8 is a graph showing characteristics of the BH lasers each having a different structure.

FIG. 8 is a graph showing characteristics of the BH lasers each having a different structure, at 25° C. and 85° C.

Figure 1:
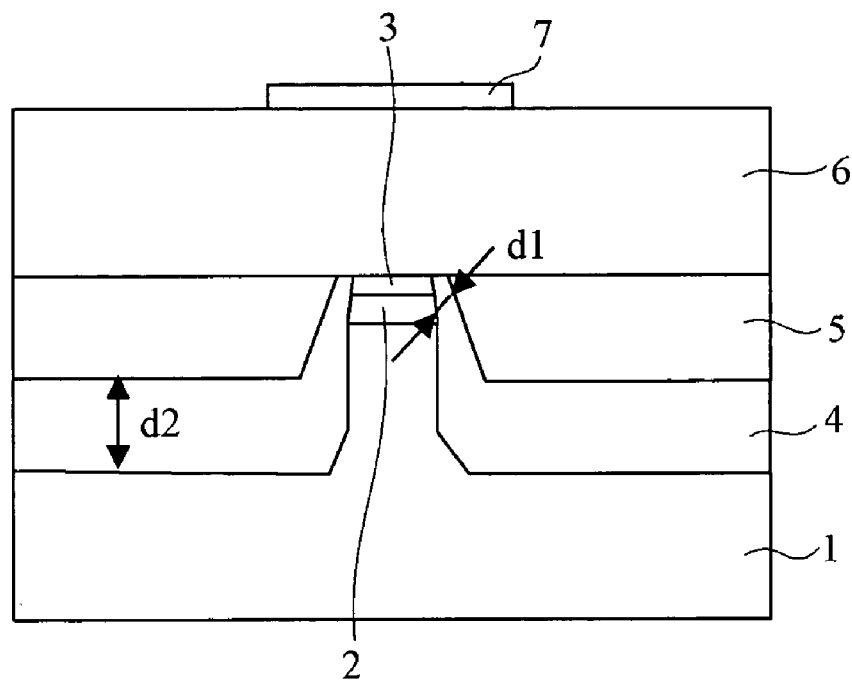
FIGS. 1 to 3 are cross sectional views for explaining a structure of a BH semiconductor layer according to a prior art.
Figure 2:
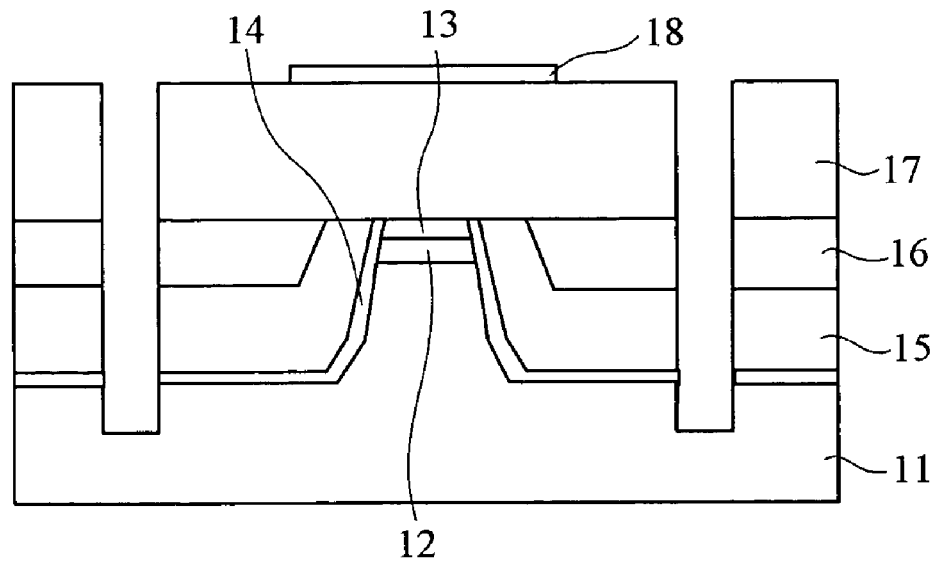

A structure 1 (curves A1 and A2) is that the p-n-p-n type semiconductor layers are eliminated, with only leaving 20 μm regions in the vicinity of the waveguide, in the case of employing common p-n-p-n semiconductor layers (referring to FIGS. 1 and 2).

Figure 3:
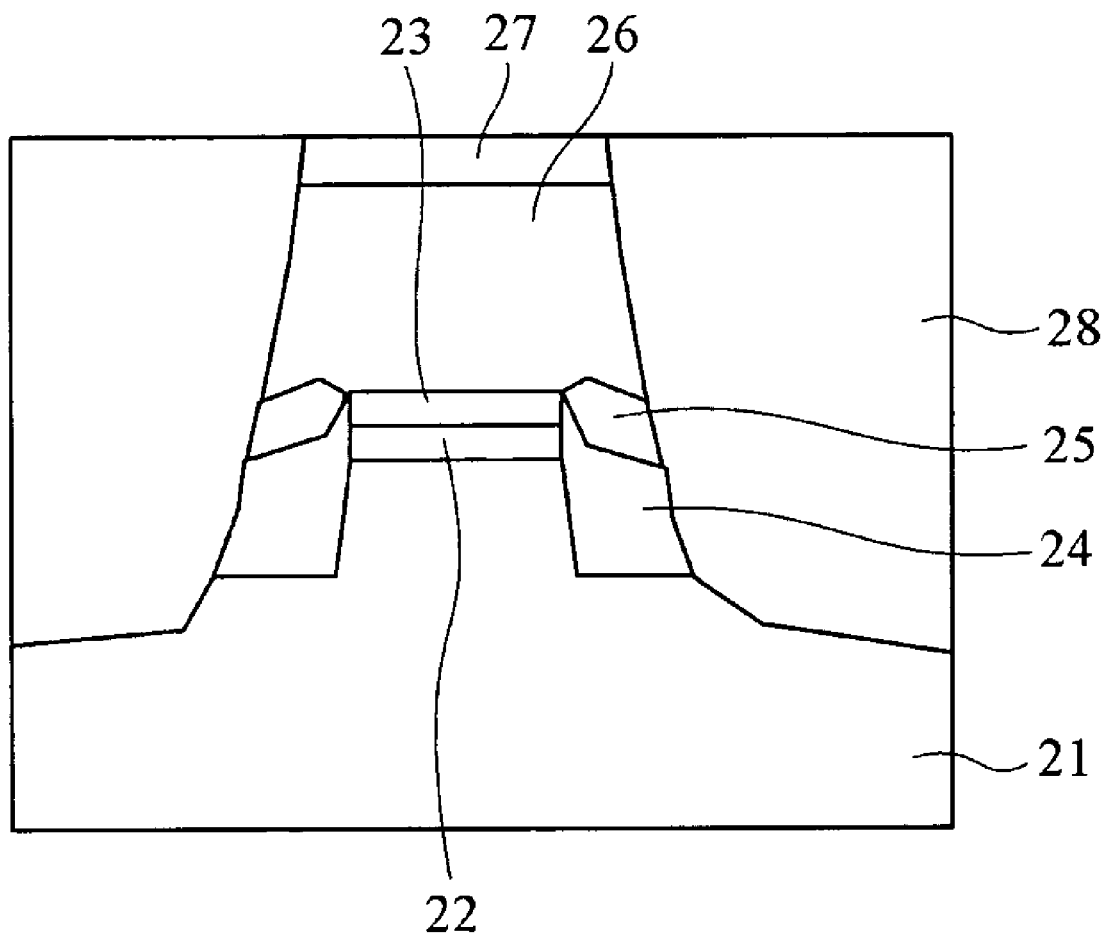

A structure 2 (curves B1 and B2) has been proposed by G. Pakulski. In the structure 2, the semiconductor layers are etched with only leaving 5 μm regions in the vicinity of the waveguide and then the etched portions are filled with the semi-insulating semiconductor (referring to FIG. 3).

A structure 3 (curves C1 and C2) has been proposed by the present invention. In the structure 3, the p type semiconductor layer 106 corresponding to a clad, as shown in FIG. 7, is etched to form patterns with a predetermined width.

According to the graph of FIG. 8, it can be noted that the three structures (structures 1 to 3) show similar characteristics at a room temperature and low operation current. However, the structures 2 and 3 (curves B1, B2, C1, and C2) show superior characteristics more than that of the conventional structure 1 (curves A1 and A2) at a high temperature and high operation current. Although the structure 2 shows a little more superior characteristic than that of the structure 3, the calculated characteristics of the two structures are almost same at a high temperature and high operation current. In this calculation, a temperature rising of a laser by currents, some portion of which cannot be converted into a light, does not take into consideration. Considering this, a characteristic difference between the three structures (structures 1 to 3) becomes further larger.

Figure 9A:
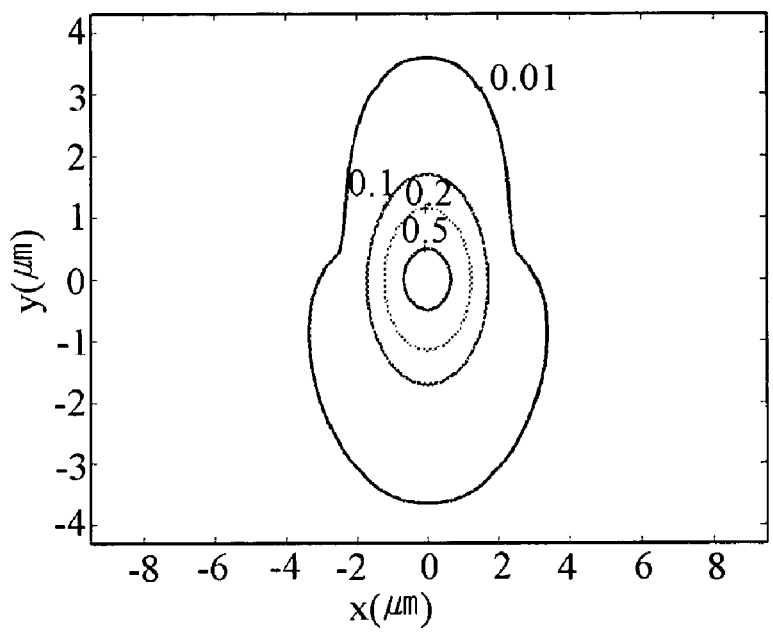
FIG. 9A is a graph showing a waveguide mode characteristic in the BH laser according to the present invention.
Figure 9B:
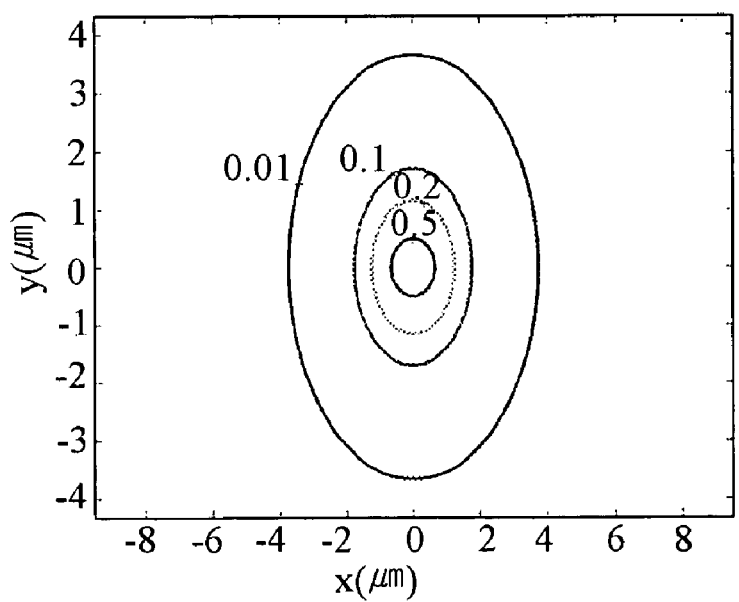
FIG. 9B is a graph showing a waveguide mode characteristic in the BH laser according to a prior art.

FIGS. 9A and 9B show a waveguide mode characteristic in the BH lasers according to the present invention and a prior art, respectively. It can be known that the structure of the present invention, in which a portion of the p type semiconductor layer corresponding to a clad is eliminated and the eliminated portion is filled with a material having low refractive index, is similar to that of a prior art. An overlap of a mode in the two structures reaches 99.7%.

In the present invention, a leakage current flowing outside an active waveguide would be prevented so as to improve a ratio of light output to input current in a BH laser. As for a current blocking method, by adapting a method of patterning a semiconductor layer corresponding to a clad with a predetermined width, thereby reducing a voltage applied to a current blocking layer, a generation of a leakage current can be prevented. As shown in FIG. 8, the BH laser of the present invention shows more excellent ratio of light output to input current than that of a conventional art. Particularly, it shows a good characteristic at a high temperature and high current.

The BH laser according to the present invention can be fabricated by using common semiconductor fabrication processes. If an optimized process is selected and applied from various processes, the BH laser having further more excellent characteristic can be obtained.

Although the present invention has been illustrated and described with respect to exemplary embodiments thereof, the present invention should not be understood as limited to the specific embodiment, and it should be understood by those skilled in the art that the foregoing and various other changes, omission and additions may be made therein and thereto, without departing from the spirit and scope of the present invention.

What is claimed is:

1. A semiconductor laser, comprising:
   a substrate etched into a mesa structure;
   an active layer formed directly on the mesa structure and being a core of a waveguide;
   a first clad layer formed on the active layer;
   a current blocking layer formed on the etched substrate in both sides of the mesa structure;
   an etch-stop layer formed on the first clad layer and the current blocking layer;
   a second clad layer formed on the etch-stop layer being located on an upper portion of the mesa structure, with a predetermined width;
   an ohmic contact layer formed on the second clad layer;
   a first electrode contacted with the ohmic contact layer; and
   a second electrode formed on a bottom side of the substrate,
   wherein the current blocking layer is formed by a first p type, an n type, and a second p type semiconductor layers.

2. The semiconductor laser as claimed in claim 1, wherein the second p type semiconductor layer is formed with a thickness of 0.2 μm or less.

3. The semiconductor laser as claimed in claim 1, wherein the second clad layer may be a p type semiconductor layer.

4. The semiconductor laser as claimed in claim 1, further comprising a layer for planarization in both sides of the second clad layer and the ohmic contact layer.

5. A semiconductor laser, comprising:
   a substrate etched into a mesa structure;
   an active layer formed on the mesa structure and being a core of a waveguide;
   a first clad layer formed on the active layer;
   a current blocking layer formed on the etched substrate in both sides of the mesa structure;
   an etch-stop layer formed on the first clad layer and the current blocking layer;
   a second clad layer formed on the etch-stop layer being located on an upper portion of the mesa structure, with a predetermined width;
   an ohmic contact layer formed on the second clad layer;
   a first electrode contacted with the ohmic contact layer; and
   a second electrode formed on a bottom side of the substrate;
   wherein the current blocking layer is formed by a first p type, an n type, and second p type semiconductor layers, and
   wherein the second p type semiconductor layer is formed with a thickness thinner than that of the first p type semiconductor layer.

6. The semiconductor laser as claimed in claim 5, wherein the second clad layer may be a p type semiconductor layer.

7. The semiconductor laser as claimed in claim 5, further comprising a layer for planarization in both sides of the second clad layer and the ohmic contact layer.

8. A semiconductor laser, comprising:
   a substrate etched into a mesa structure;
   an active layer formed on the mesa structure and being a core of a waveguide;
   a first clad layer formed on the active layer;
   a current blocking layer formed on the etched substrate in both sides of the mesa structure;
   an etch-stop layer formed on the first clad layer and the current blocking layer;
   a second clad layer formed on the etch-stop layer being located on an upper portion of the mesa structure, with a predetermined width;
   an ohmic contact layer formed on the second clad layer;
   a first electrode contacted with the ohmic contact layer; and
   a second electrode formed on a bottom side of the substrate;
   wherein the current blocking layer is formed by a first p type, an n type, and a second p type semiconductor layers;
   wherein the second p type semiconductor layer is formed with a thickness thinner than that of the first p type semiconductor layer; and
   wherein the second p type semiconductor layer is formed with a thickness of 0.2 μm or less.

9. The semiconductor laser as claimed in claim 8, wherein the second clad layer may be a p type semiconductor layer.

10. The semiconductor laser as claimed in claim 8, further comprising a layer for planarization in both sides of the second clad layer and the ohmic contact layer.

* * * * *